United States Patent
Slattery et al.

(10) Patent No.: US 10,181,853 B2
(45) Date of Patent: Jan. 15, 2019

(54) CONFIGURABLE HARDWARE PLATFORM FOR MEASUREMENT OR CONTROL

(71) Applicant: Analog Devices Global, Hamilton (BM)

(72) Inventors: Colm Slattery, Clonmel (IE); Patrick C. Kirby, Limerick (IE); Albert O'Grady, Limerick (IE); Denis O'Connor, Limerick (IE); Michael Collins, Clare (IE); Valerie Hamilton, Limerick (IE); Aidan J. Cahalane, County Clare (IE); Michal Brychta, Limerick (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/456,160

(22) Filed: Mar. 10, 2017

(65) Prior Publication Data

US 2017/0264295 A1    Sep. 14, 2017

Related U.S. Application Data

(60) Provisional application No. 62/306,882, filed on Mar. 11, 2016, provisional application No. 62/377,770, filed on Aug. 22, 2016.

(51) Int. Cl.
    *H03K 19/0175*    (2006.01)
    *H01L 27/02*      (2006.01)
    (Continued)

(52) U.S. Cl.
    CPC .......... *H03K 19/017581* (2013.01); *G01R 31/31712* (2013.01); *H01L 27/0255* (2013.01); *H03K 19/17764* (2013.01)

(58) Field of Classification Search
    None
    See application file for complete search history.

(56) References Cited

U.S. PATENT DOCUMENTS

| 4,646,299 A | * | 2/1987 | Schinabeck | ........ | G01R 31/3191 |
|---|---|---|---|---|---|
|  |  |  |  |  | 324/73.1 |
| 5,444,644 A |  | 8/1995 | Divjak |  |  |

(Continued)

FOREIGN PATENT DOCUMENTS

WO    WO-2017153847    9/2017

OTHER PUBLICATIONS

"International Application Serial No. PCT/IB2017/000353, International Search Report dated Jul. 3, 2017", 4 pgs.

(Continued)

*Primary Examiner* — Crystal L Hammond

(74) *Attorney, Agent, or Firm* — Schwegman Lundberg & Woessner, P.A.

(57) ABSTRACT

Systems for monitoring or control can include reconfigurable input and output channels. Such reconfigurable channels can include as few as a single terminal and a ground pin, or such channels can include three or four terminal configuration such as for use in four-terminal resistance measurements. Channel reconfiguration can be accomplished such as using software-enabled or firmware-enabled control of channel hardware. Such channel hardware can include analog-to-digital and digital-to-analog conversion capability, including use of a digital-to-analog converter to provide field power or biasing. In an example, the interface circuit can provide a selectable impedance.

26 Claims, 14 Drawing Sheets

(51) Int. Cl.
*H03K 19/177* (2006.01)
*G01R 31/317* (2006.01)

(56) References Cited

U.S. PATENT DOCUMENTS

| | | | |
|---|---|---|---|
| 5,467,024 | A | 11/1995 | Swapp |
| 7,271,752 | B2 | 9/2007 | Stoll |
| 7,903,008 | B2 | 3/2011 | Regier |
| 8,009,078 | B1 | 8/2011 | Alley |
| 8,054,208 | B2 | 11/2011 | Fletcher et al. |
| 8,373,586 | B2 | 2/2013 | Alley et al. |
| 8,392,626 | B2 | 3/2013 | Wormmeester et al. |
| 8,604,862 | B2 | 12/2013 | Birk et al. |
| 8,656,065 | B1 | 2/2014 | Gerhart et al. |
| 8,806,085 | B2 | 8/2014 | Mathason et al. |
| 8,924,600 | B2 | 12/2014 | Alley et al. |
| 9,116,531 | B2 | 8/2015 | Alley et al. |
| 2003/0057990 | A1* | 3/2003 | West ............... G01R 31/31924 324/750.01 |
| 2006/0100812 | A1* | 5/2006 | Sturges ............ G01R 31/3172 702/117 |
| 2006/0132158 | A1 | 6/2006 | Miller |
| 2006/0202707 | A1* | 9/2006 | Harjung ............ G01R 31/3004 324/756.04 |
| 2009/0167357 | A1* | 7/2009 | Lai .................. H03K 19/01758 326/82 |
| 2010/0306518 | A1* | 12/2010 | Suryawanshi ........... G06F 1/24 713/1 |
| 2012/0306517 | A1* | 12/2012 | Regier ............. G01R 31/2841 324/750.01 |
| 2016/0056823 | A1* | 2/2016 | Ho .................. H03K 19/01758 326/41 |
| 2017/0010994 | A1 | 1/2017 | Stoll |

OTHER PUBLICATIONS

"International Application Serial No. PCT/IB2017/000353, Written Opinion dated Jul. 3, 2017", 10 pgs.

"Fully Programmable Universal Analog Front End for Process Control Applications", Analog Devices, Circuit Note CN-0209, (Jan. 2011), 5 pgs.

"Quad Channel, 16-Bit, Serial Input, 4 mA to 20 mA and Voltage Output DAC, Dynamic Power Control, HART Connectivity", Analog Devices—AD5755-1, (Apr. 2011), 52 pgs.

"Quad Parametric Measurement Unit with integrated 16-Bit Level Setting DACs", Analog Devices—AD5522, (Jul. 2008), 65 pgs.

"Super universal modules TXM1.8X TXM1.8X-ML", Siemens 8174, (Mar. 30, 2007), 10 pgs.

"User Defined Fault Protection and Detection,10 O RON, Quad Channel Protector", Analog Devices—ADG5462F, (Jan. 2016), 30 pgs.

Slattery, Colm, et al., "PLC Evaluation Board Simplifies Design of industrial Process-Control Systems", Analog Dialog 43-04, (Apr. 2009), 8 pgs.

* cited by examiner

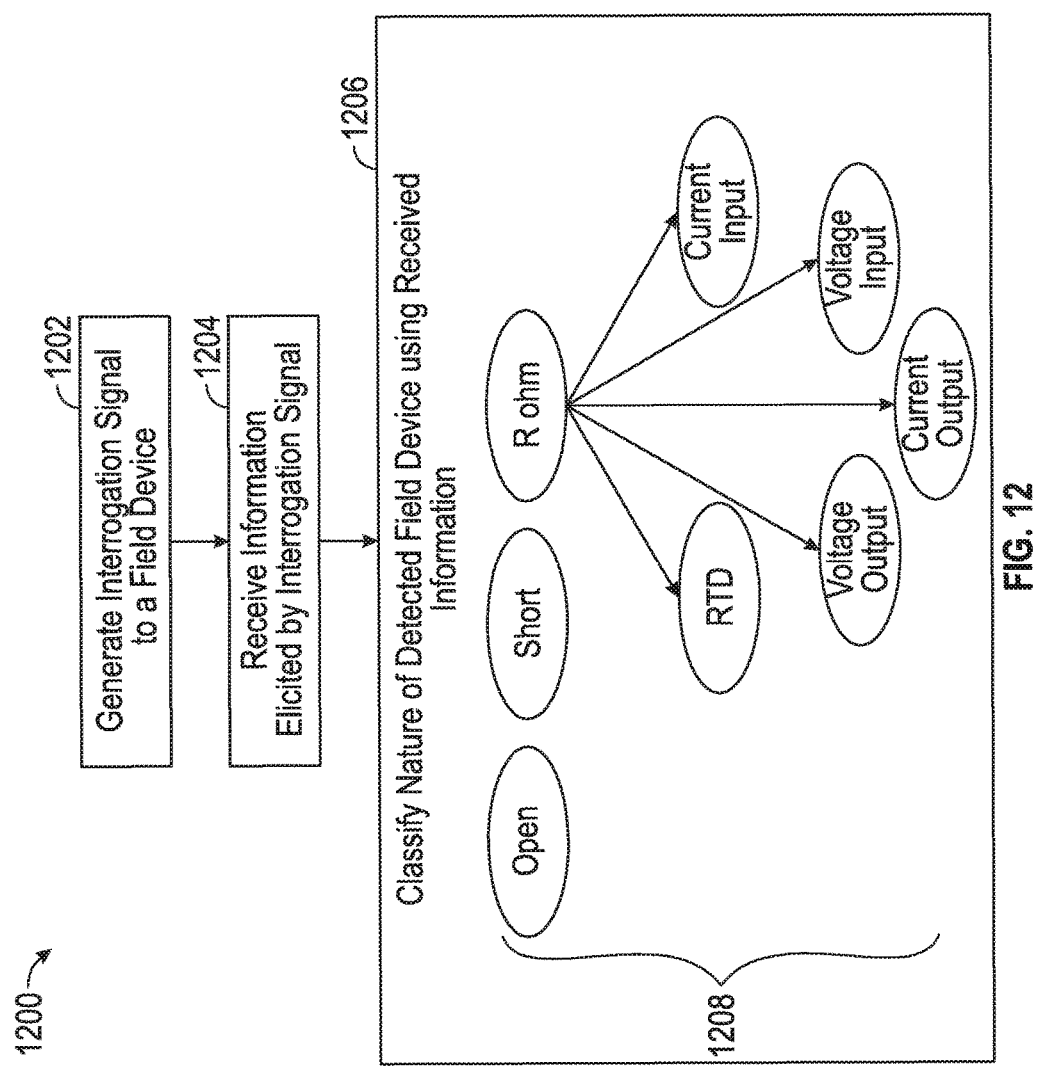

CONFIGURABLE HARDWARE PLATFORM FOR MEASUREMENT OR CONTROL

CLAIM OF PRIORITY

This patent application claims the benefit of priority of (1) Slattery et al., U.S. Provisional Patent Application Ser. No. 62/306,882, titled "CONFIGURABLE HARDWARE PLATFORM FOR MEASUREMENT AND CONTROL," filed on Mar. 11, 2016; and (2) Kirby et al., U.S. Provisional Patent Application Ser. No. 62/377,770, titled "PROGRAMMABLE SOURCE-MEASURE INTERFACE CIRCUIT," filed on Aug. 22, 2016, the entireties of each of which are hereby incorporated by reference herein.

FIELD OF THE DISCLOSURE

This document pertains generally, but not by way of limitation, to analog and digital interface circuits, and more particularly to interface circuits having configurable analog and digital operational modes.

BACKGROUND

Electronic modules can be used to facilitate monitoring or control for applications such as chemical or industrial process control, motion control, building control such as for control of Heating, Ventilation, and Air Conditioning (HVAC), and SCADA. Such modules can have hardware interfaces that provide current or voltage output, and separate inputs such as for monitoring current, voltage, or resistance (such as for measurement using Resistance Temperature Devices (RTDs)). Electronic modules can provide signal conditioning, such as including one or more of filtering or protection devices, and can provide analog-to-digital conversion capability.

SUMMARY OF THE DISCLOSURE

Mechanical and hardware configurations for electronic modules used for control or monitoring can be highly complex, particularly when large channel counts are used. In one approach, dedicated hardware interface channels can be used, such as configured exclusively for current or voltage mode operation, and configured exclusively for use as an input channel or an output channel. Such dedicated channels can be coupled to mechanical terminals (e.g., screw terminals). To provide input capability, a group of input channels are generally permanently configured as inputs. Similarly, to provide output capability, a group of output channels are generally permanently configured as outputs. However, such an approach can have disadvantages. For example, instead of having two physical terminals per channel, each input or output can have two or more terminals. An output configured to support current or voltage mode operation might include three or even four terminals. Such extra dedicated terminals can needlessly clutter a hardware interface, and dedicated channel arrangements may hinder flexibility because system requirements or a particular application may dictate an evolving assignment of a particular hardware channel.

The present inventors have also recognized, among things, that systems for monitoring or control can instead include one or more reconfigurable channels, such as including respective channels configurable for use as either an input or an output channel. Such reconfigurable channels can each include as few as a single non-ground terminal and a ground or reference terminal, or such channels can include a three or a four terminal configuration such as for use in three-terminal or four-terminal resistance measurements.

Channel reconfiguration can be accomplished such as using software-enabled or firmware-enabled control of channel hardware. Such channel hardware can include analog-to-digital and digital-to-analog conversion capability, including use of a digital-to-analog converter to provide field power or biasing. In this manner, a complexity of a hardware interface (e.g., a count of physical interface channels connected to terminals, such as screw terminals) can be reduced as compared to non-configurable approaches, because particular channels can be configured flexibly to function as either an input, an output, or a combination of both (such as an input where the channel can also provide field power output, stimulus, or a bias signal).

In an example, a software-implemented or firmware-implemented technique can include semi-automatic or automatic detection of a load connected to terminals for a particular channel. For example, such a technique can include automatically detecting a mis-wire condition (such as an open-circuit, short-circuit condition, or a condition where power supply wiring is inadvertently connected to one or more input or output terminals). In an example, such a technique can include prompting a user to select an appropriate mode based on an interrogation of connected load devices, such as to facilitate switching between a current-based mode of operation and a voltage-based mode of operation, as an example.

In an example, a configurable interface circuit can support multiple selectable operational modes, including modes for analog measurement and analog output on a configurable channel coupleable to at least one field device, the interface circuit comprising an integrated circuit including a configurable drive circuit including a current mode of operation wherein a resistor is coupled to the drive circuit, the resistor to provide a current measurement element and a current control element, and a configurable measurement circuit configured to monitor, using the resistor, a current forced through the configurable drive circuit by a field device, the resistor coupled to the configurable drive circuit and the configurable measurement circuit, where the configurable drive circuit and the configurable measurement circuit define the configurable channel.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 12 illustrates generally a technique, such as a method, that can include generating an interrogation signal to a field device, and receiving information elicited by the interrogation signal, such as for use in selecting an operational mode of an interface circuit.

Figure 1:
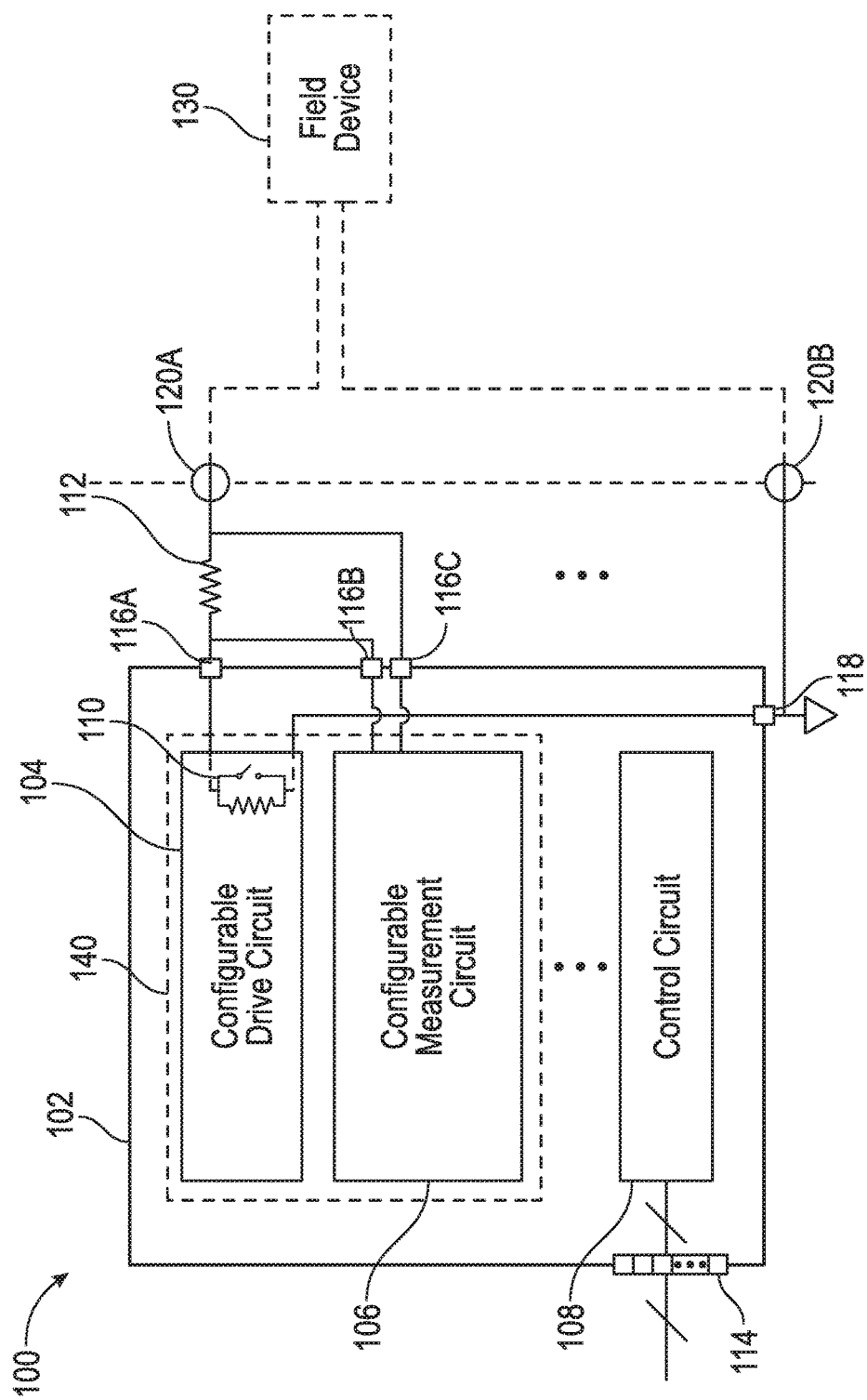
FIG. 1 illustrates generally an example comprising an interface circuit that can include a configurable drive circuit and a configurable measurement circuit, where the interface circuit can be coupled to one or more field devices.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As mentioned above, the present inventors have recognized, among other things, that systems for monitoring or control can instead include one or more reconfigurable channels. Such a flexible configuration allows the system to be interconnected with various field devices including various transducers or actuators, as illustrative examples. Such reconfigurable channels can each include as few as a single non-ground terminal and a ground or reference terminal, or such channels can include a three or a four terminal configuration such as for use in three-terminal or four-terminal resistance measurements. Channel reconfiguration can be accomplished such as using software-enabled or firmware-enabled control of channel hardware. Channel hardware can include analog-to-digital and digital-to-analog conversion capability, including use of a digital-to-analog converter to provide field power or biasing. In this manner, a complexity of a hardware interface (e.g., a count of physical interface channels connected to terminals, such as screw terminals) can be reduced as compared to non-configurable approaches, because particular channels can be configured flexibly to function as either an input, an output, or a combination of both (such as an input where the channel can also provide field power output, stimulus, or a bias signal, as illustrative examples).

In an example, digital-to-analog conversion circuitry, analog-to-digital conversion circuitry, signal conditioning circuitry, and other circuitry such as control logic can be co-integrated using a commonly-shared integrated circuit or integrated module package. Such an integrated circuit or integrated module package can facilitate use of large channel counts by conserving area and simplifying the hardware engineering task when such circuits or module packages are included as a portion of an electronic control or monitoring module.

Aspects of a configurable interface circuit as shown and described herein can include one or more of the following capabilities, such as can be provided in a configurable manner by as few as a single signal terminal and a reference (ground) terminal:

1) Source current (e.g., 4 to 20 milliamps (mA)) and contemporaneously measure load voltage;

2) Sink current and contemporaneously measure current (e.g., 4 to 20 mA);

3) Source current and contemporaneously measure current (e.g., 4 to 20 mA);

4) Output voltage (e.g., selected from a range of about −10 Volts (V) to +10V) and contemporaneously measure load current;

5) Source high current with short circuit protection (optionally also sink high current) and contemporaneously measure current;

6) Measure external resistance;

7) Measure voltage;

8) Convert input voltage to logic level (e.g., using configurable thresholds for logic levels);

9) Convert one or more of input or output current to logic levels (e.g., using configurable thresholds for logic levels);

10) Tolerate overvoltage on the output terminal (e.g., sustain a voltage in the range of from about −40V relative to the reference node, to about +40V relative to the reference node); and 11) Provide a selectable impedance for contemporaneous digital communication and analog measurement on a configurable channel.

According to an illustrative example, high external component counts and use of high-voltage switch devices are not necessary to provide the capabilities above. Such aspects ease complexity of integration of the interface circuit in a system, and can reduce the system vulnerability to unwanted emissions or susceptibility from an electromagnetic compatibility (EMC) perspective.

Generally, an architecture for the interface circuit examples described herein can include separate output and measurement paths. As shown in the illustrative examples described herein, most circuitry related to the configurable input/output functions can be monolithically integrated using a commercially-available fabrication process. External protection devices can be simplified or eliminated, such as allowing use of as few as a single diode on an output channel to provide channel protection for suppression of electrical over-stress, such as without adversely impacting a terminal impedance provided by the interface circuit as a whole.

Mode selection for the examples described in this document can be achieved such as by enabling or disabling one or more functional blocks of an integrated circuit, or by grounding one or more nodes. In this manner, multiplexing of current mode signals is not required. In an example, as few as a single resistive element (e.g., a sense resistor) can be coupled to a channel to provide a current-setting element and a current-monitoring element, without requiring a separate calibration resistor. Sensed current can be determined by monitoring a voltage across such as resistor, output voltage can be determined by monitoring a node of the resistor on the output side of the circuit relative to a reference (e.g., ground) node, and resistance measurement can be performed such as by monitoring an intermediate node coupled to the sense resistor relative to a reference node.

Fault-tolerance of the examples described herein can be provided using various techniques. In one approach, series resistors can be included on each terminal or in-line with respective integrated circuit device pins. However, the present inventors have recognized that such an approach can have disadvantages, because such series resistors can increase the terminal series impedance in an unwanted manner. Such resistors can also create one or more of unwanted power dissipation or thermal management issues, such as contributing to unwanted temperature increase when the interface circuit is located in a confined location. By contrast, the interface circuit and system examples described herein can provide robust fault protection while maintaining a desired input impedance. In an example, the impedance presented by the interface circuit can be selectable, such as to conform to a specified impedance range associated with a digital communication protocol, or to provide a lower impedance for certain operating modes while still maintaining fault tolerance under transient or sustained terminal voltage excursions.

FIG. 1 illustrates generally an example comprising an interface circuit 100 that can include a configurable drive circuit 104 and a configurable measurement circuit 106, where the interface circuit 100 can be coupled to one or more field devices, such as a field device 130. The use of the phrase "field device" can generally refer to one or more of an actuator, sensor, or other device. The field device 130 need not be located a particular distance from the interface circuit 100, but would generally be located remotely with respect to the interface circuit 100. The field devices can be coupled to the interface circuit such as using one or more screw terminals or other electrical interconnections, such as including a first terminal 120A, and a second terminal 120B. In an example, the second terminal 120B can be commonly-shared amongst multiple field devices as a ground or common terminal. The interface circuit 100 can include an integrated circuit package 102, such as having one or more monolithically-integrated circuits housed with the package 102. A combination of the configurable drive circuit 104 and the configurable measurement circuit 106 can define a configurable channel 140, and the interface circuit 100 can include multiple channels, such as implemented within the integrated circuit package 102.

In an example, one or more of the configurable drive circuit 104, the configurable measurement circuit 106, and a control circuit 108 can be co-integrated in a commonly-shared monolithic integrated circuit. The control circuit 108 can include one or more of a state machine, a micro-controller architecture, a general-purpose processor circuit, or can include one or more configurable logic devices, as illustrative examples. A digital interface 114 can be provided, such as providing one or more of a serial or parallel communication interface. Interface circuit 100 configuration information can be provided such as via the digital interface 114 and can be used by the control circuit to select an operational mode of the interface circuit 100, such as by enabling or disabling various functional elements included in one or more of the configurable drive circuit 104 or the configurable measurement circuit 106.

The integrated circuit package 102 can include one or more pins, such as to permit flexibility in applications for the interface circuit 100. For example, the configurable drive circuit 104 can be coupled to an output pin 116A. A first node of a sense resistor 112 can be coupled between the output pin 116A and a second pin 116B, such as where the second pin 116B is coupled to the measurement circuit 106. Alternatively, or in addition, the sense resistor 112 can be located internally to the integrated circuit package 102. The measurement circuit 106 can also be coupled to a third pin 116C, such coupled to a second node of the sense resistor 112, so that the measurement circuit 106 can monitor a voltage drop across the sense resistor 112. In an illustrative example, the sense resistor 112 can contribute to an overall impedance presented by the interface circuit 100 to the terminals 120A and 120B. The configurable drive circuit can optionally include a selectable impedance circuit 110, such as to change the input impedance presented by the interface circuit 100. As an illustrative example, the interface circuit 100 can support at least two selectable impedances, including a controlled-impedance mode and a lower-impedance mode. The controlled-impedance mode can provide a specified impedance range, such as to permit digital communication on a channel including conductors coupled to the terminals 120A and 120B, such as contemporaneously with other stimulus, measurement, or combined stimulus and measurement on the channel.

Figure 2:
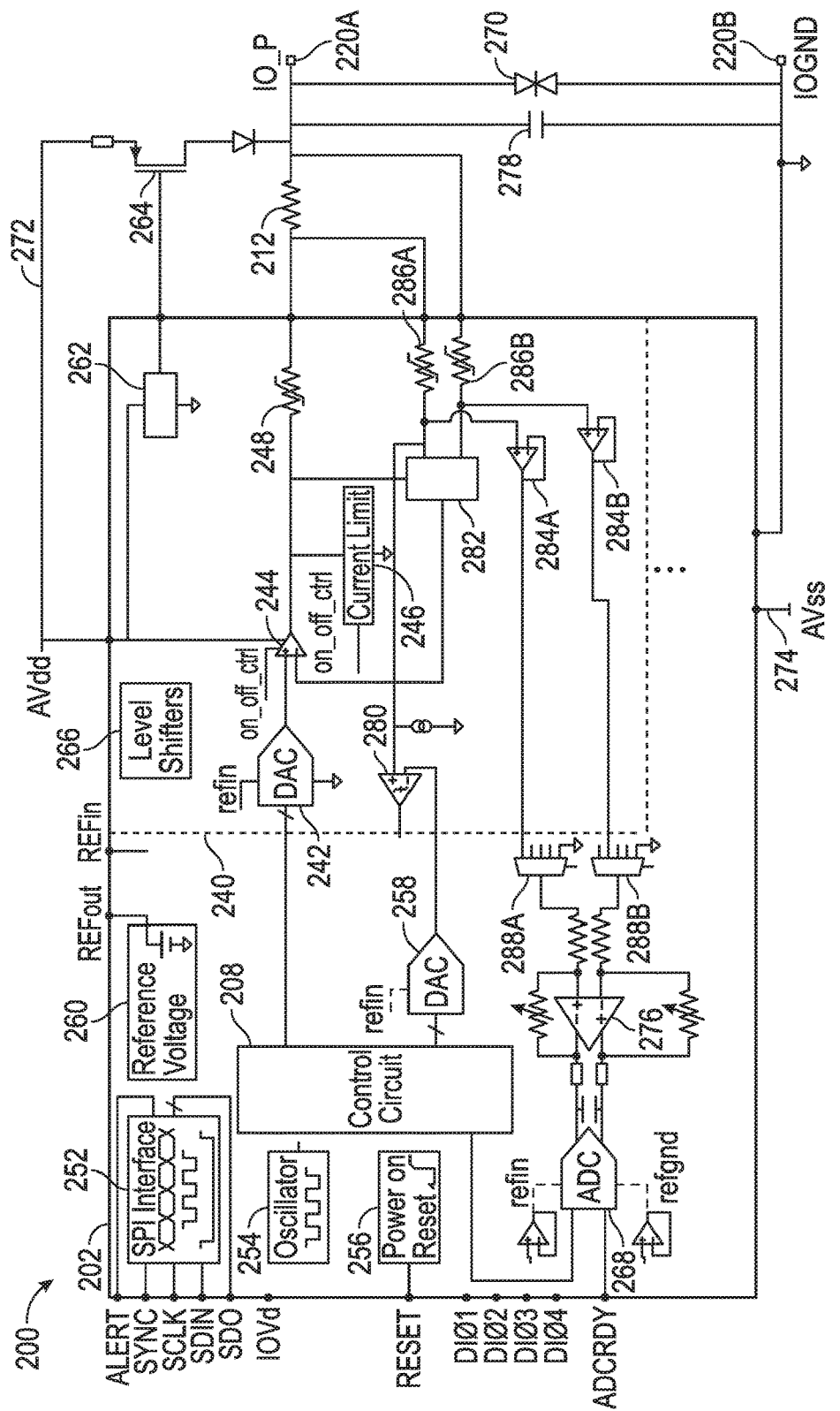
FIG. 2 illustrates generally an illustrative example of an interface circuit, such as including an integrated circuit defining a configurable channel, the channel configured to provide various operational modes.

FIG. 2 illustrates generally an illustrative example of an interface circuit 200, such as including an integrated circuit package 202 defining a configurable channel 240, the channel configured to provide various operational modes. In the detailed example of FIG. 2, the integrated circuit package 202 can include a monolithic circuit having various functional blocks. Such blocks can include a reference circuit 260, an oscillator circuit 254, a reset management circuit 256, a communication interface circuit 252 (e.g., supporting a Serial Peripheral Interface (SPI) protocol or other protocol), and a level shifter circuit 266. A configurable drive circuit as mentioned in relation to other examples herein can include a digital-to-analog converter circuit 242, such as having a 16-bit resolution or other resolution, coupled to an error amplifier circuit 244. A feedback circuit 282 can provide an input to the error amplifier circuit 244 such that the configurable drive circuit maintains a desired output voltage or current depending on the interface circuit 200 operational mode. For a digital output operational mode, a switch driver circuit 262 can be included, such as to drive a switch (e.g., a transistor 264) external to the integrated circuit package 202. A commonly-shared positive supply voltage AVdd can be coupled to one or more portions of the interface circuit 200. The interface circuit 200 can support multiple reference or ground domains, such as having a first reference node 274, such as coupled to AVss, and a separate ground node, such as coupled to the second terminal 220B.

In the illustrative example of FIG. 2, a configurable measurement circuit can include various elements, such as a comparator circuit 280 having inputs coupled to an input node and a programmable digital-to-analog converter circuit (DAC) 258. The input node can be coupled to a first node of an external sense resistor 212 (or the sense resistor can be included within the commonly-shared integrated circuit package 202). A separate fully-differential measurement path can be provided, such as having buffer circuits 284A and 284B in-line with respective multiplexer circuits 288A and 288B. In this manner, a programmable-gain differential amplifier 276 can be shared across multiple measurement channels using the respective multiplexer circuits 288A and 288B. A differential output of the programmable-gain differential amplifier 276 can provided to a precision analog-to-digital converter circuit (ADC) 268 such as providing a 16-bit resolution, a 24-bit resolution, or another specified bit resolution.

As in the example of FIG. 1, as few as a single resistor 212 can be coupled to a configurable channel, such as to provide one or more of current setting (e.g., control), current measurement, or voltage measurement, without requiring a separate calibration resistor. The value of the resistor 212 can be less than 100 ohms, and separate series protection resistors are not required. The examples described herein, such as shown in FIG. 2, can include various protection schemes to avoid damage when a voltage excursion occurs as one or more of the first terminal 220A or the second terminal 220B. In an example, an external clamp circuit 270, such as including one or more diodes, can be placed across the terminals 220A and 220B (corresponding to nodes labeled IO_P and IOGND). A capacitor 278 can be placed across the terminals 220A and 220B, in addition to, or instead of the claim circuit 270.

In an example, various "on-chip" protection circuits can be included, such as current limiting circuit 246 on an output of the amplifier circuit 244, or one or more series protection circuits such as a protection circuit 248 on an output of the drive circuit, or protection circuits 286A and 286B on the inputs to the feedback circuit 282 or other circuits. The protection circuit 248 or circuits 286A and 286B can include or can be implemented in a manner similar to the fault protection circuits available from Analog Devices, Inc. (Norwood, Mass., USA) in the ADG5462F circuit, such as having latch-up immunity, an on-resistance of less than 10 ohms, and immunity to 4 kV electrostatic discharge events using a Human Body Model (HBM), along with overvoltage protection spanning from negative voltages of −40 V or more negative voltages to +40V or more positive voltages, relative to a reference voltage. Such protection circuits can be referred to generally as "channel protectors."

Figure 3:
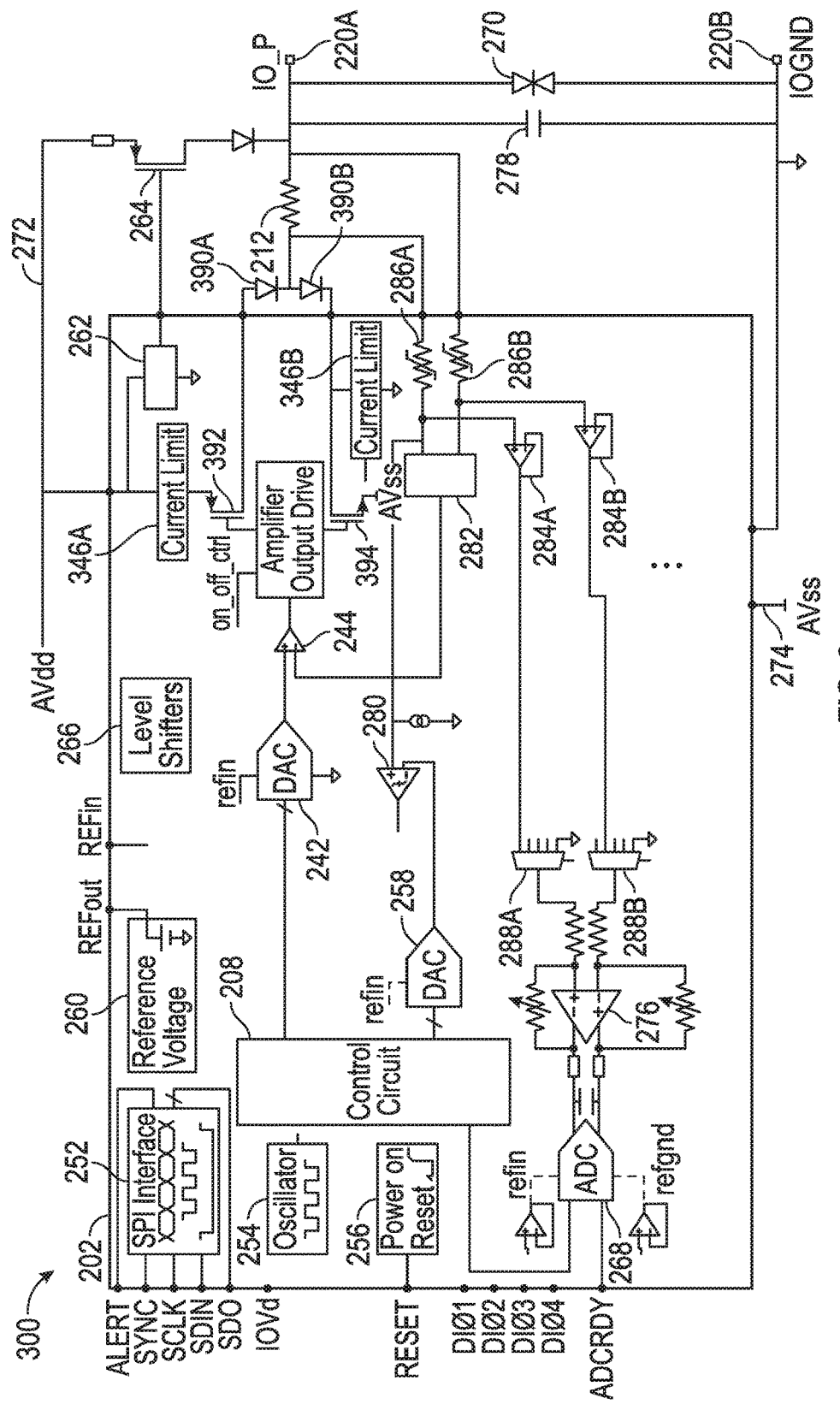
FIG. 3 illustrates generally another illustrative example of an interface circuit, such as including an integrated circuit defining a configurable channel, the channel configured to provide various operational modes including providing a drive circuit and one or more external protection circuits.

FIG. 3 illustrates generally another illustrative example of an interface circuit 300, such as including an integrated circuit package 202 defining a configurable channel, the channel configured to provide various operational modes including providing a drive circuit and one or more external protection circuits. The interface circuit 300 can be similar to the examples shown in FIG. 1 and FIG. 2, such as including a communication interface circuit 252, an oscillator circuit 254, a reset management circuit 256, a reference circuit 260, one or more level shifter circuits 266, a DAC 242, an error amplifier circuit 244, a feedback circuit 282, buffer circuits 284A and 284B, multiplexer circuits 288A and 288B, a programmable-gain differential amplifier 276, a precision ADC 268, a comparator circuit 280, and threshold selection DAC 258. The circuit 300 can include an external switch (e.g., a transistor 264) for a digital voltage output operational mode, such as driven by a switch driver circuit 262, an external resistor 212, and terminals 220A and 220B. As in the example of FIG. 1 and FIG. 2, various protection schemes can be used. In the interface circuit 300 of FIG. 3, a clamp circuit 270 and capacitor 278 can be provided across the terminals 220A and 220B.

One or more external protection circuits can be used, such as first and second diodes 390A and 390B along current sourcing and sinking pathways. The diodes 390A and 390B can be replaced with one or more on-chip or off-chip protection circuits such as one or more channel protectors having a structure similar to the ADG5462F device mentioned above. If a single output pin is used (as in the example of FIG. 2), a single diode or channel protector can be used as shown in FIG. 2 (e.g., as shown in the location of the protection circuit 248 in FIG. 2 or externally to the integrated circuit package 202 of FIG. 2). Use of protection circuits as shown in FIG. 2 and FIG. 3, as illustrative examples, can limit current when an output pin is exposed to a positive or negative-going voltage excursion. Referring to FIG. 3 and by contrast with FIG. 2, the error amplifier circuit 244 can drive one or more output transistors, such as a first transistor 392 or a second transistor 394. The circuit paths associated with the first transistor 392 or the second transistor 394 can include respective current limiting circuits 346A and 346B.

Figure 4A:
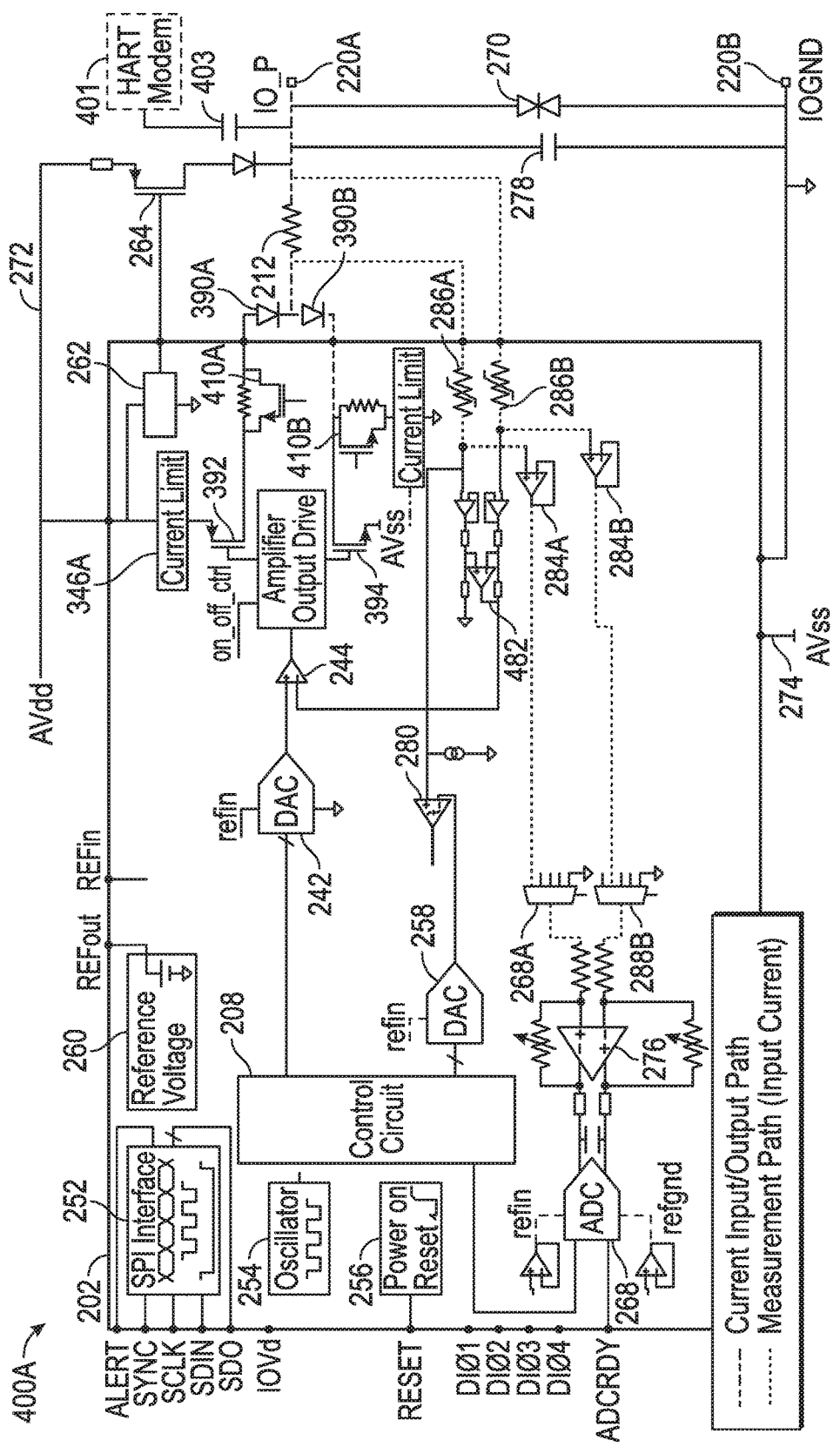
FIG. 4A illustrates generally an illustrative example of an interface circuit, such as having a configurable channel configured to provide a selectable impedance, where the configurable channel is arranged to provide a current-loop mode of operation where the loop current is generated elsewhere.

FIG. 4A illustrates generally an illustrative example of an interface circuit 400A, such as having a configurable channel configured to provide a selectable impedance using one or more of a first selectable impedance circuit 410A and a second selectable impedance circuit 410B, where the configurable channel is arranged to provide an analog current-loop mode of operation for measuring an analog current, where the current is generated elsewhere. Generally, in the illustrative example of FIG. 4A, the interface circuit 400A can route current being forced from an external field device, such as a sensor coupled to the terminals 220A and 220B, through the resistor 212 (Rsense). The current limiting circuit 346B can provide a pathway for the forced current, and a voltage developed across the sense resistor 212 can be measured using the precision ADC 268 signal chain. The selectable impedance circuit 410B can provide two modes of operation, including a controlled-impedance mode where a combination of the on-chip resistance provided by the selectable impedance circuit 410B and the resistor 212 present a series impedance within a specified range. For example, the specified range can include a range from about 230 Ohms to about 600 Ohms, such as defined in relation to a Highway Addressable Remote Transducer (HART) protocol or other digital communication scheme. In this manner, the analog current measurement provided by monitoring the voltage across the resistor 212 can occur contemporaneously with digital communication superimposed on the channel defined by the terminals 220A and 220B, such as digital communication provided by a HART modem 401 capacitively coupled to the analog current measurement channel. The "measurement path" shown illustratively in FIG. 4A could additionally, or alternatively, be used to measure an output voltage developed at either of the resistor 212 terminals, such as with respect to ground or another reference voltage.

With regard to the HART protocol, generally speaking, the HART protocol allows an alternating current (AC) communication signal to be super-imposed on a lowerfrequency 4-20 mA analog current signal. An interface circuit according to the examples herein may be measuring or driving the 4-20 mA current loop while a HART transaction (e.g., transmit/receive) is occurring contemporaneously. A "low impedance" device in the context of the HART protocol can refer to a device that is measuring an analog current in the range of 4-20 mA while a HART transmit/receive is occurring. The phrase "low impedance" in the context of the HART protocol can refer to a controlled impedance between 230 to 600 ohms. In applications where a current measurement channel is not being used contemporaneously with HART communication, a lower impedance is generally desired, such as less than the 230 ohms minimum impedance specified for HART. Accordingly, the examples of FIGS. 4A and 4B, and other examples herein, can include a selectable "termination" impedance as described above and below.

Figure 4B:
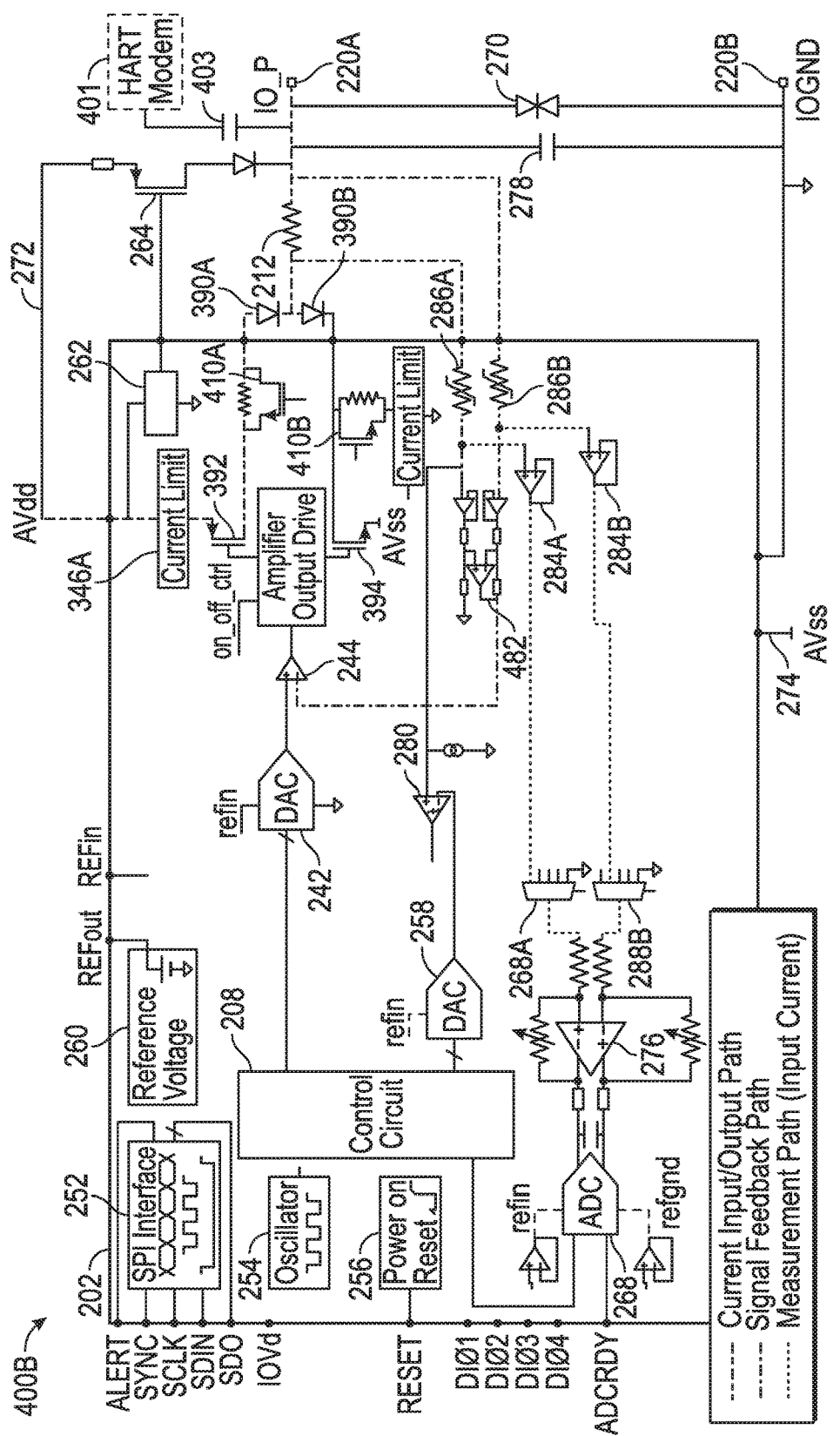
FIG. 4B illustrates generally an illustrative example of an interface circuit, such as having a configurable channel configured to provide a selectable impedance, where the configurable channel is arranged to provide a current-loop mode of operation where the power for the loop current is provided by the interface circuit.

FIG. 4B illustrates generally an illustrative example of an interface circuit 400B, such as having a configurable channel configured to provide a selectable impedance using one or more of a first or second selectable impedance circuit 410A or 410B, where the configurable channel is arranged to provide an analog current-loop mode of operation where the power for the loop current is provided by the interface circuit 400B. FIG. 4B can include a similar circuit topology to the example of FIG. 4A, but in the operational mode of FIG. 4B, the interface circuit 400B forces a voltage approximating AVdd onto the resistor 212. The IR-drop provided by the sense resistor can be used to limit the maximum current sourced by the interface circuit 400B, such as in addition to a current limiting circuit 346A or instead of the limiting circuit 346A, and closed-loop regulation can be provided using the feedback path shown through the error amplifier circuit 244. The resistor 212 can be contemporaneously used to measure the current, such as using the indicated "measurement path" using the precision ADC 268 signal chain in a manner similar to the example of FIG. 4A. Additionally, or instead, a voltage developed at either terminal of the resistor 212 can be measured using the measurement path. In the examples of FIG. 4A and FIG. 4B, a more-detailed feedback amplifier topology 482 is shown as an illustrative example.

For analog current measurements where a selectable impedance is not required (e.g., non-HART implementations), the series impedance provided by the selectable impedance circuits 410A and 410B can be bypassed by a switch (e.g., a parallel transistor as shown in each circuit 410A and 410B), or the selectable impedance circuits 410A and 410B can be omitted. When the selectable impedance circuits 410A and 410B are bypassed, the impedance presented by the interface circuit 400A of the operational mode of FIG. 4A or the interface circuit 400B of the operational mode of FIG. 4B can be a lower-impedance, such as less than about 100 ohms, but having a non-zero value and including a contribution from the resistor 212.

Figure 5:
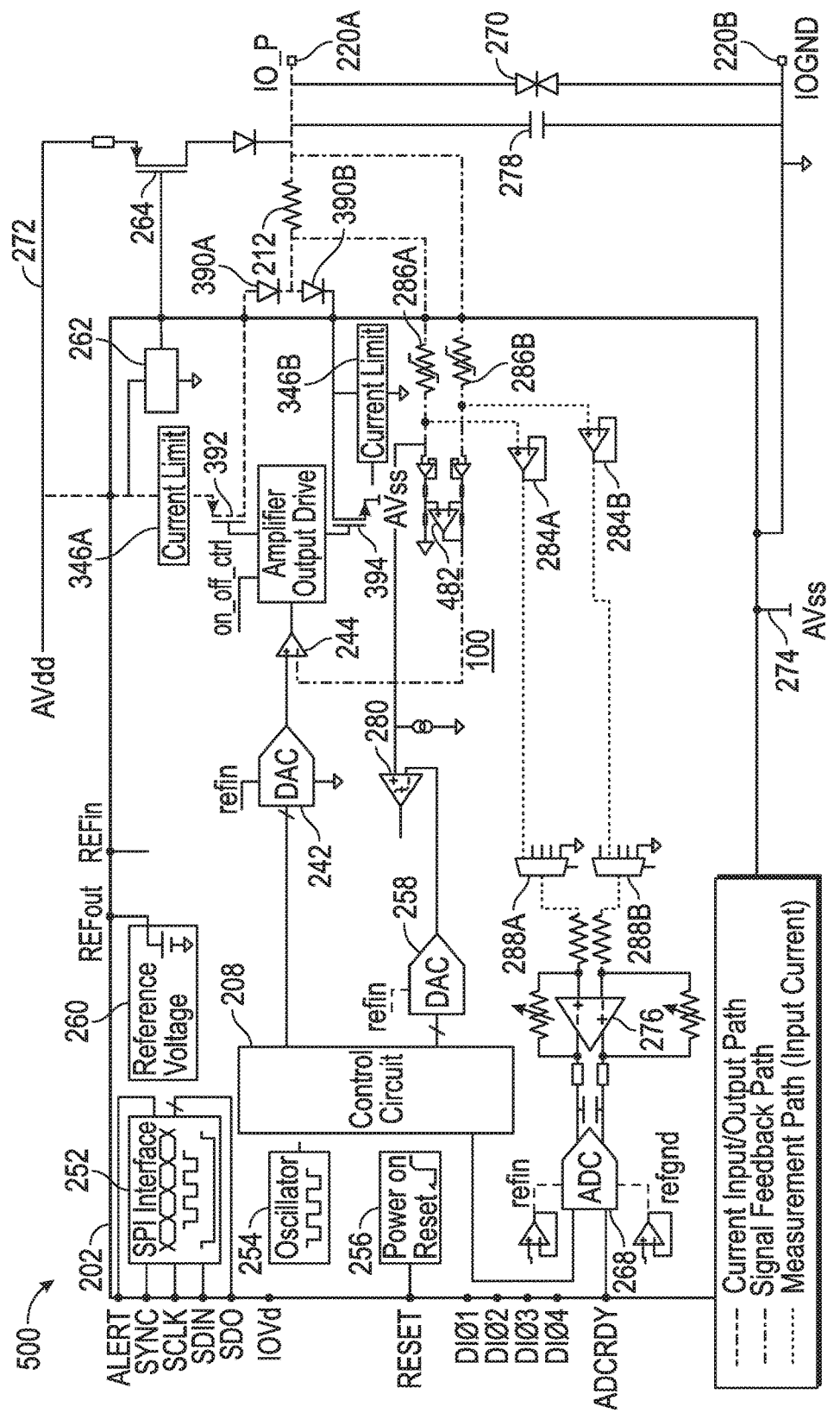
FIG. 5 illustrates generally an illustrative example of an interface circuit, such as having a configurable channel, the channel configured to provide an analog current output mode including generating a specified analog output current.

FIG. 5 illustrates generally an illustrative example of an interface circuit 500, such as having a configurable channel to provide an analog current output mode including generating a specified analog output current. In a manner similar to the operational mode of FIG. 4B, a high-side switch 392 can be used to couple a terminal of the resistor 212 to the AVdd node. By contrast with FIG. 4B, instead of merely limiting the current by monitoring the voltage across the resistor 212 and measuring the current throttled by a field device, the error amplifier circuit 244 can be used in combination with the feedback circuit 482 to servo the high-side switch to establish a specified analog output current to a field device. As in other examples described herein, the measurement path can include use of the precision ADC 268, such as for monitoring a voltage across the resistor 212, or for monitoring an output voltage of the interface circuit 500, such as at a node of the resistor coupled to the output terminal 220A with respect to a reference (e.g., a ground node coupled to terminal 220B).

Figure 6A:
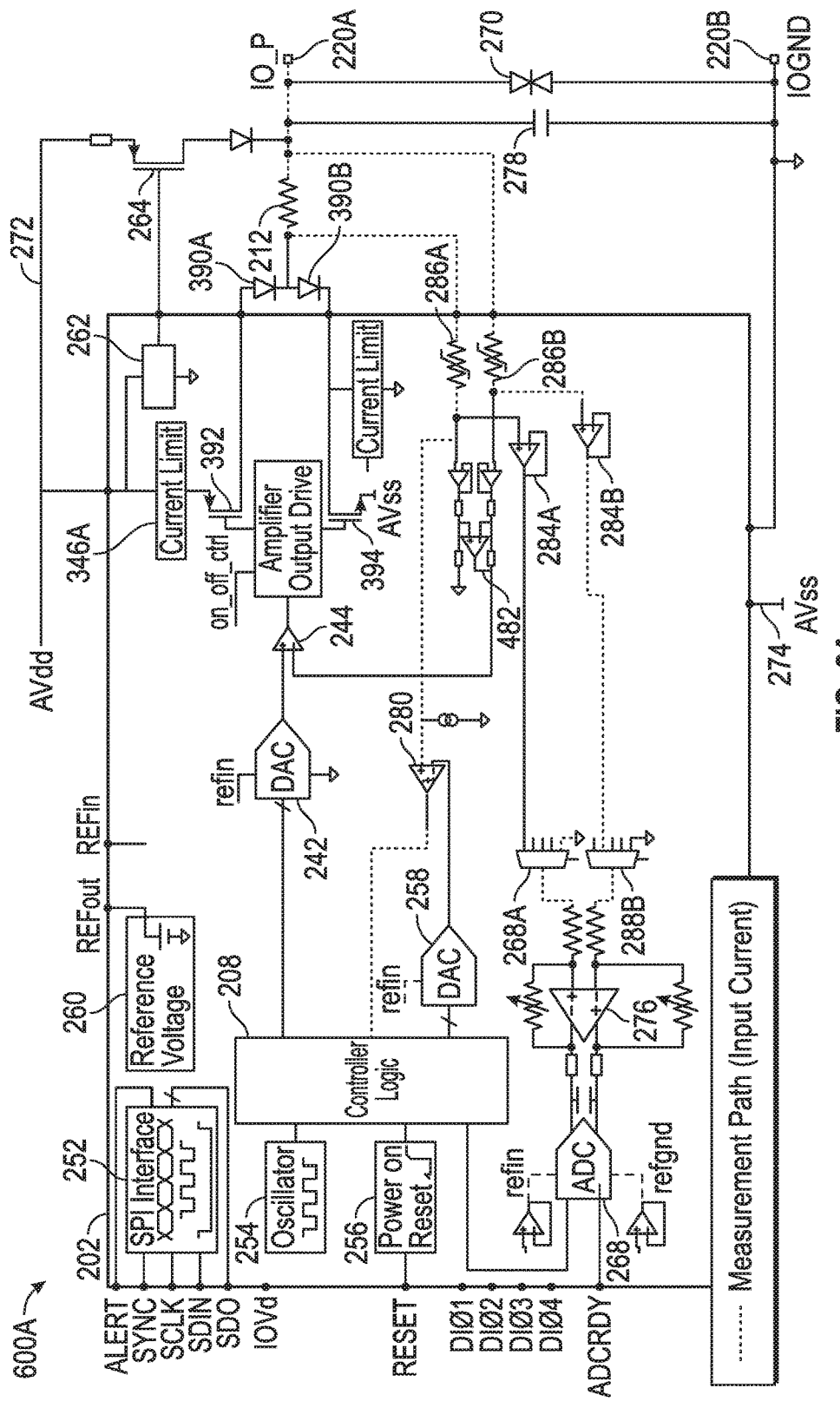
FIG. 6A illustrates generally an illustrative example of an interface circuit, such as having a configurable channel, the channel configured to provide a digital logic-level voltage input mode to detect a digital input signal.

FIG. 6A illustrates generally an illustrative example of an interface circuit 600A, such as having a configurable channel to provide a digital logic-level voltage input mode to detect a digital input signal. In the example of FIG. 6A, two paths are available to provide detection of a voltage-mode digital input signal. A first path can include routing a voltage at a node of the resistor 212 to the threshold comparator circuit 280. A variety of different digital signaling schemes can be detected, such as using a programmable threshold provided by the threshold selection DAC 258. Alternatively, or in addition, the differential measurement input channel can be operated in a single-ended manner (e.g., by coupling one of the input terminals to ground using the multiplexer circuit 288A) and an input voltage can be measured or digitized using the precision ADC 268 signal chain.

Figure 6B:
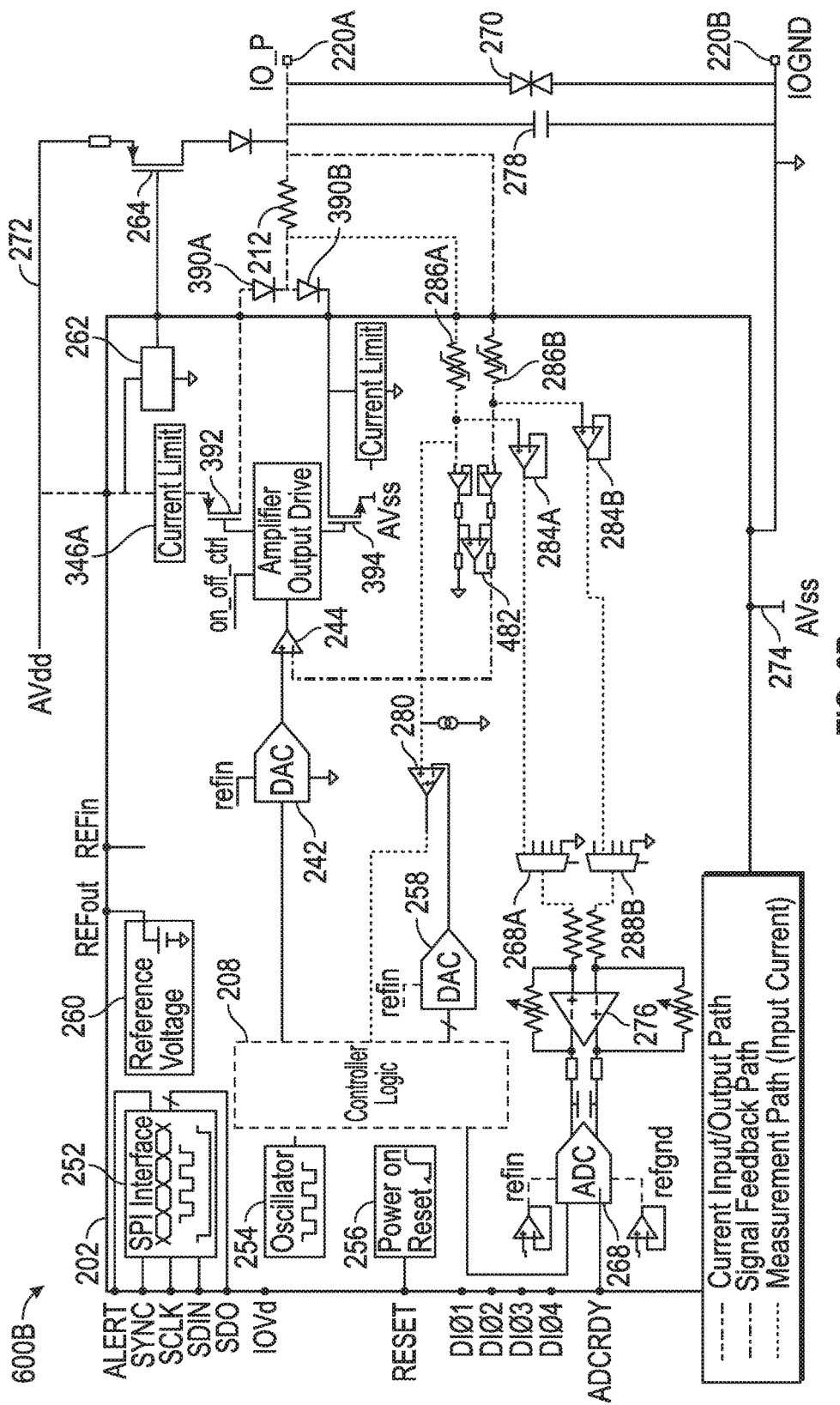
FIG. 6B illustrates generally an illustrative example of an interface circuit, such as having a configurable channel, the channel configured to provide a digital logic-level current input mode, and particularly where the configurable channel is configured to provide a current-loop mode of operation where the power for the loop current is provided by the interface circuit.

FIG. 6B illustrates generally an illustrative example of an interface circuit 600B, such as having a configurable channel to provide a digital current input mode, and particularly where the configurable channel is configured to provide a current mode of operation where the power for the loop current is provided by the interface circuit 600B. In a manner similar to the operational mode of FIG. 4B, a high-side switch 392 can be used to couple a terminal of the resistor 212 to the AVdd node. As the field device interrupts a current loop coupled to the interface circuit 600B, a voltage at a terminal of the resistor 212 can be routed to the comparator circuit 280. The feedback circuit 482 can be used to provide feedback, such as for a closed-loop current-limiting scheme. Optionally, a value of the digital input current can be measured such as using the precision ADC 268 signal chain. As in other examples described herein, the operational mode depicted in the example of FIG. 6B constrains the majority of the current to a path through the high-side switch 392 of a configurable driver circuit. The feedback and measurement pathways carry a current having a value orders of magnitude lower than the current source or sink path through the drive circuit.

Figure 7:
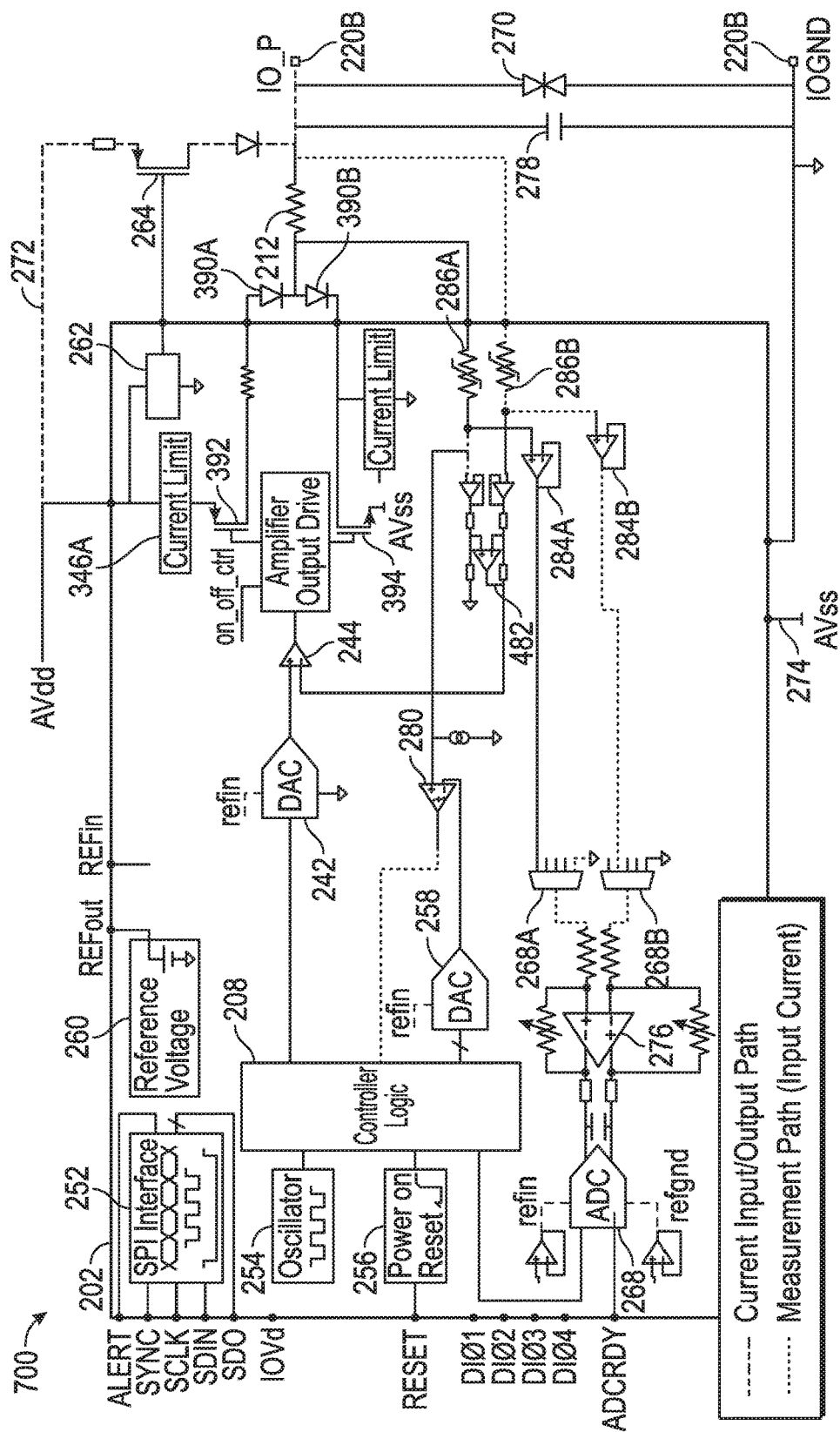
FIG. 7 illustrates generally an illustrative example of an interface circuit configured to provide a digital output mode to force a current through the output terminal.

FIG. 7 illustrates generally an illustrative example of an interface circuit 700 configured to provide a digital output mode to force a current through the output terminal 220A. The interface circuit 700 can include a switch driver circuit 262 such as coupled to a switch (e.g., a PMOS transistor 264) located externally to the integrated circuit package 202 of the interface circuit 700. The transistor 264 can force a current through a loop including the IO_P node at the first terminal 220A, and can use a return path provided by the second terminal 220B. A voltage developed at the IO_P output node connected to the first terminal 220A can be monitored, such as by coupling a terminal of the resistor to the precision ADC 268 measurement signal chain, and measuring the voltage with respect to the ground node (in a manner similar to the example of FIG. 6A).

Figure 8:
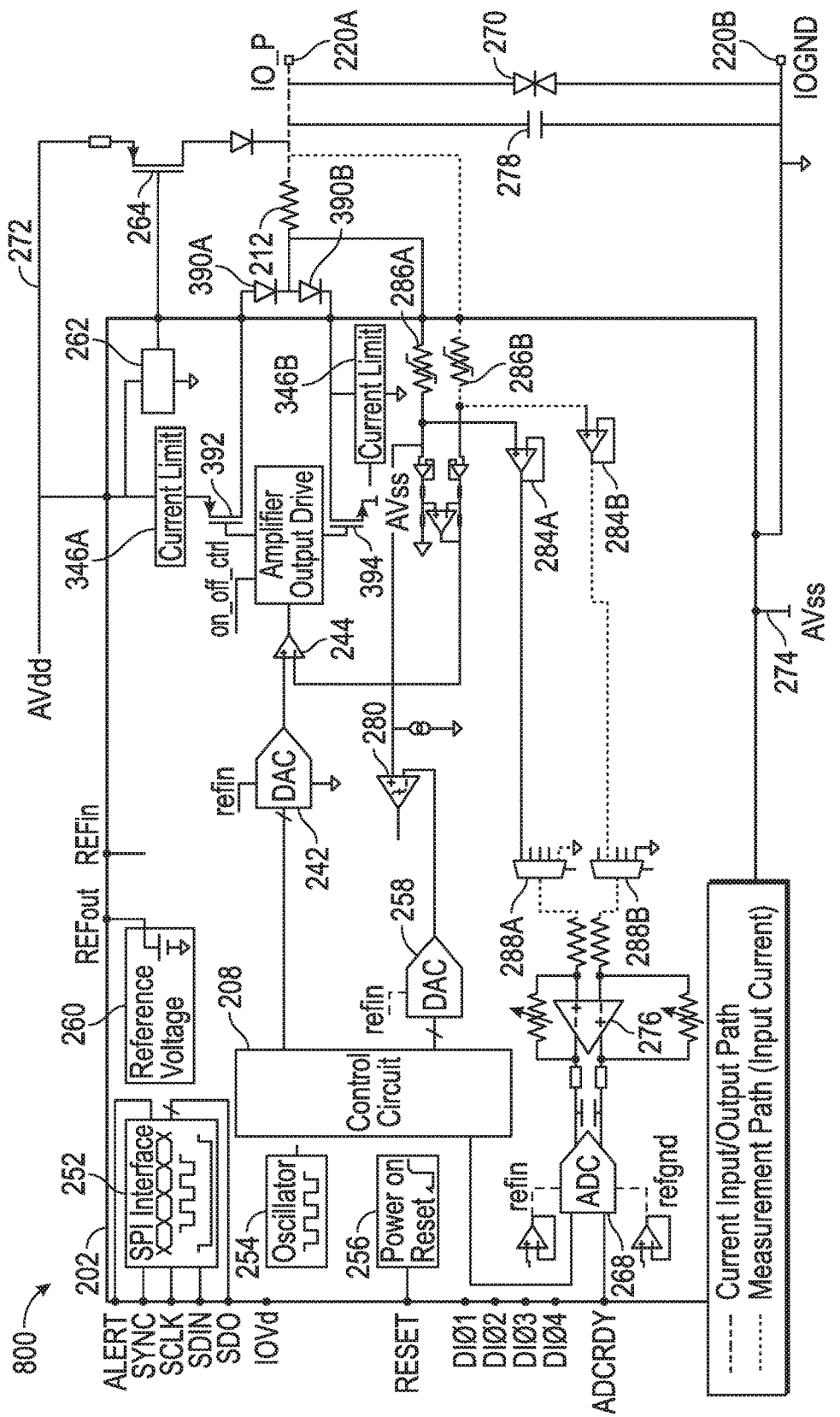
FIG. 8 illustrates generally an illustrative example of an interface circuit, such as having a configurable channel, the channel configured to provide an analog voltage input mode to measure an analog input voltage.

FIG. 8 illustrates generally an illustrative example of an interface circuit 800, such as having a configurable channel to provide an analog voltage input mode to measure an analog input voltage. In a manner similar to FIG. 6A and FIG. 7, a voltage provided at the IO_P output node can be monitored, such as by coupling a terminal of the resistor to the precision ADC 268 measurement signal chain, and measuring the voltage with respect to the ground node.

Figure 9:
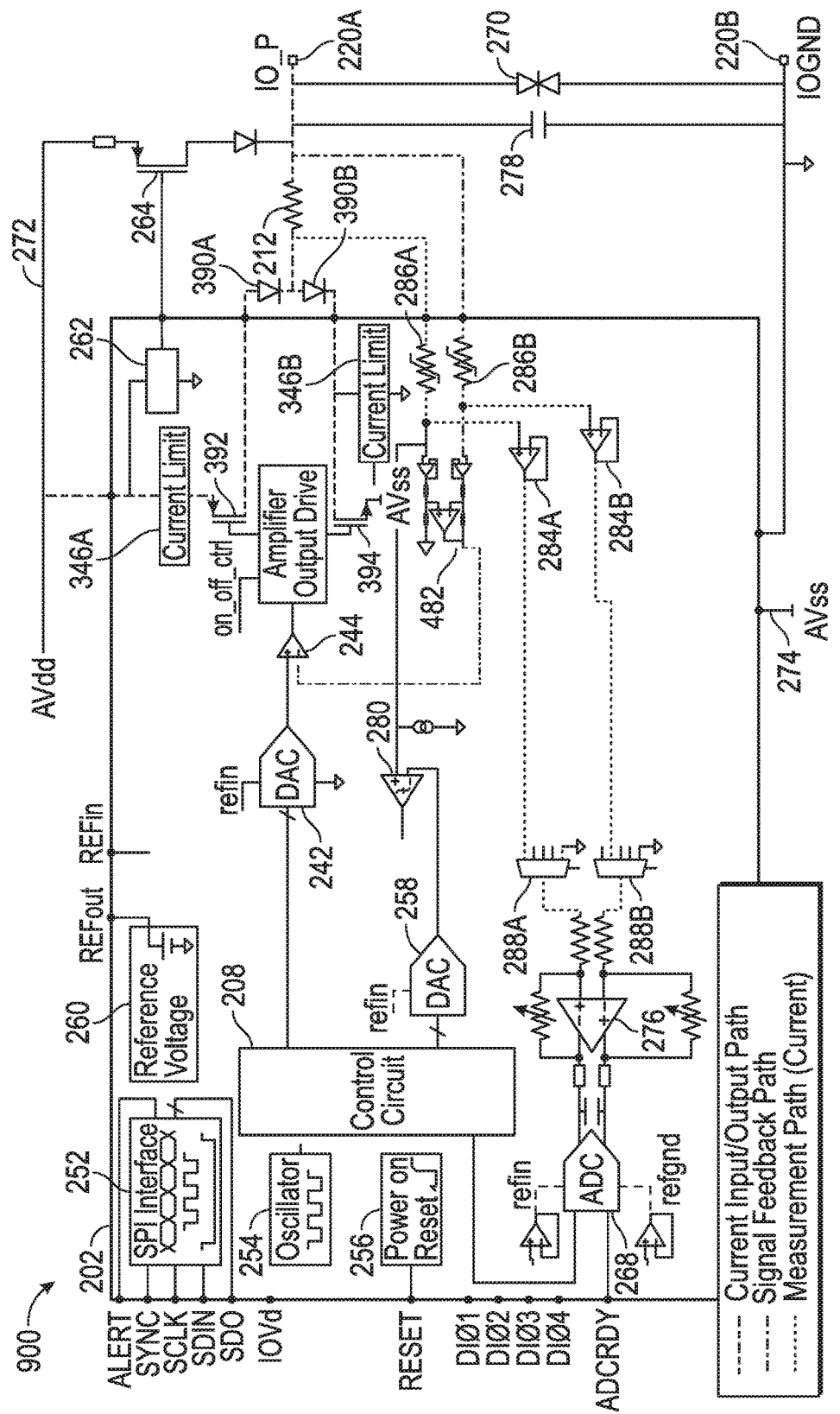
FIG. 9 illustrates generally an illustrative example of an interface circuit, such as having a configurable channel, the channel configured to provide an analog voltage output mode to generate a specified analog output voltage.

FIG. 9 illustrates generally an illustrative example of an interface circuit 900, such as having a configurable channel to provide an analog voltage output mode to generate a specified analog output voltage at the IO_P node, relative to the IOGND node. A feedback path through the feedback circuit 482 to the error amplifier circuit 244 can be used to regulate the output voltage developed at a terminal of the resistor 212 coupled to the IO_P node. One or more of the output current or the output voltage can be fed through the measurement circuit as shown in FIG. 9, using the precision ADC 268 signal chain. If the output voltage is monitored, the ADC 268 signal chain can be configured to perform a single-ended measurement of the IO_P terminal 220A voltage, relative to IOGND. In another example, the voltage drop across the resistor 212 can be used to monitor the output current when a specified analog output voltage is provided.

Figure 10:
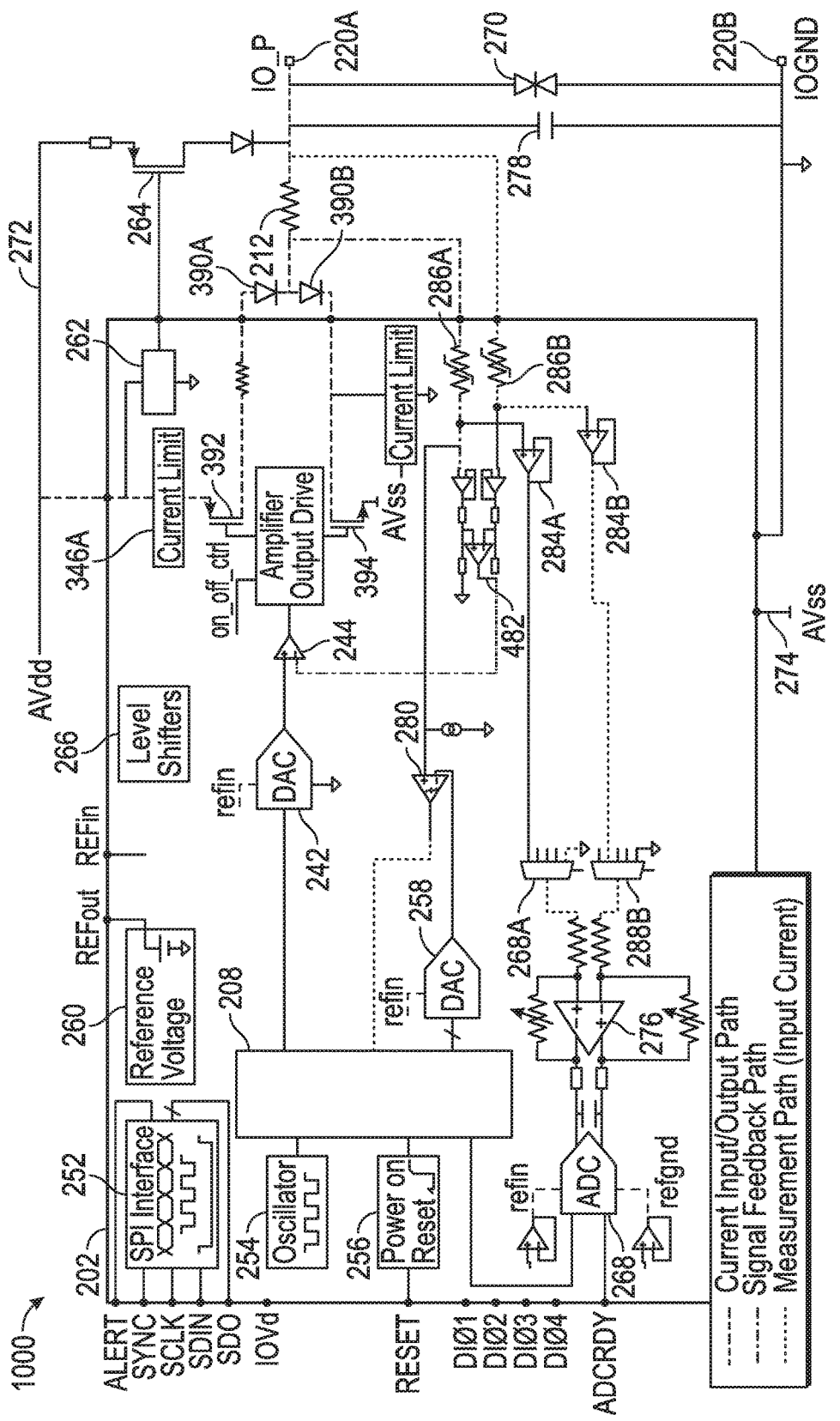
FIG. 10 illustrates generally an illustrative example of an interface circuit, such as having a configurable channel, the channel configured to provide a temperature measurement mode, such as when the channel is coupled to a resistance temperature detector (RTD).

FIG. 10 illustrates generally an illustrative example of an interface circuit 1000, such as having a configurable channel to provide a resistance measurement mode, such as for a temperature measurement mode, such as when the channel is coupled to a resistance temperature detector (RTD). As an illustrative example, the high and low side switches 392 and 394 can be driven to establish a specified output voltage at a first terminal of the resistor 212 (e.g., a terminal opposite the IO_P node). The voltage can be regulated using a feedback path provided through the feedback circuit 482 and the error amplifier circuit 244. A voltage drop across the resistor 212 can be monitoring using the measurement circuit, such as using the precision ADC 268 signal chain. The control circuit can determine a measured resistance using information about the programmed output voltage and the measured voltage at a terminal of the resistor 212 opposite the output, along with a known value for the resistor 212. Similar techniques can be used for 3 or 4-wire RTD measurements, such as to nullify a resistance contribution from cabling or other interconnects leading to an RTD transducer. For example, additional ADC 268 input paths can be used and a series of measurements can be performed for use extracting a resistance contribution provided by the RTD transducer. The control circuit can include an operational mode where a measured resistance value is converted to a temperature value corresponding to the type of transducer in use.

The present inventors have recognized, among other things, that the current flowing through the measurement branches of the interface circuits shown and described in the examples above can be limited to very low currents, such as on the order of a microampere. Using a configurable drive circuit capable of sourcing or sinking relatively high currents (such as greater than or equal to about 1 milliamp (mA), separate from the measurement circuit, simplifies the interface circuit topology and operation, such as by eliminating a requirement for high-voltage tolerant or high-current-carrying switching or multiplexing within the measurement signal chain. Instead, mode switching can be achieved by enabling or disabling circuit blocks in the measurement chain or drive circuit signal chain, or by connecting various nodes to ground. In this manner, the cost and complexity of the interface circuit can be reduced (such as by eliminating switches that consume large die area), without sacrificing robustness to voltage excursions.

Figure 11:
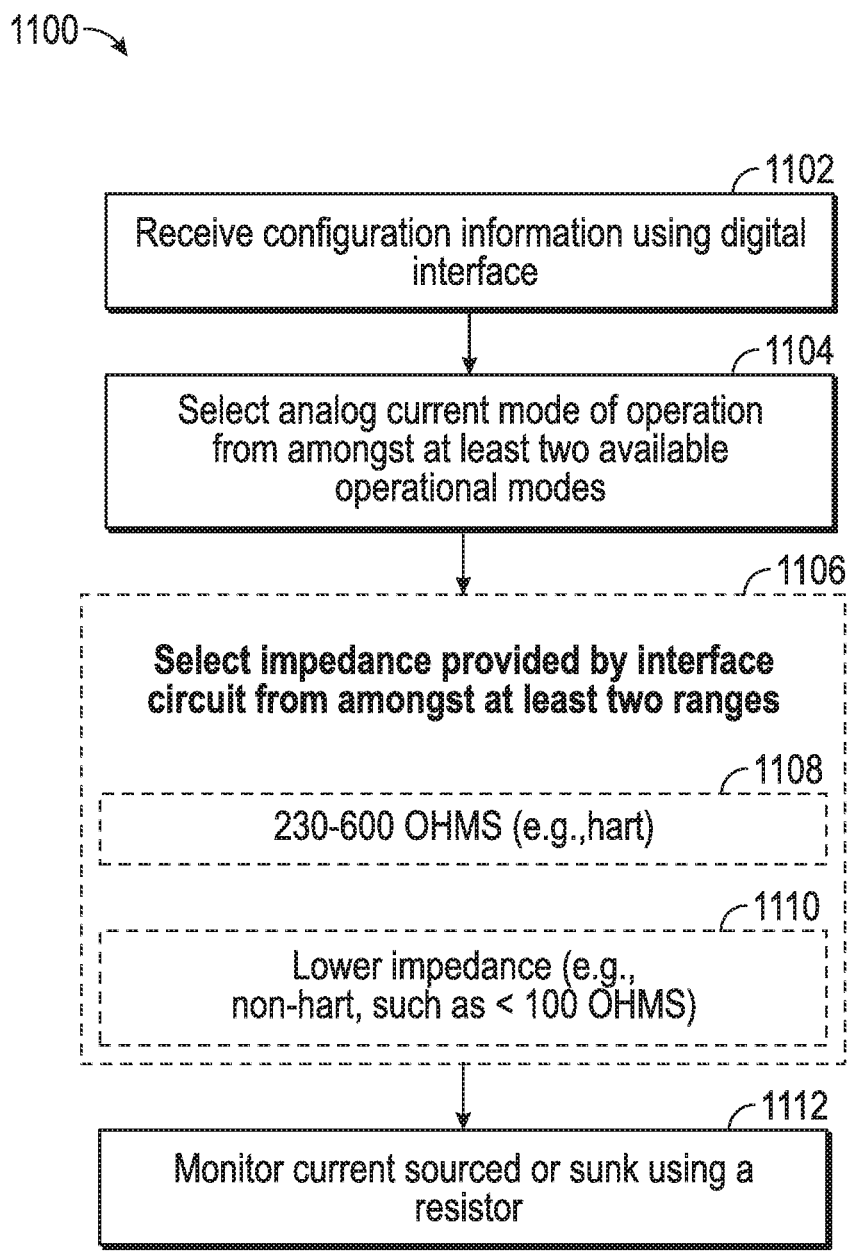
FIG. 11 illustrates generally a technique, such as a method, that can include receiving configuration information and selecting an operational mode of an interface circuit.

FIG. 11 illustrates generally a technique 1100, such as a method, that can include receiving configuration information and selecting an operational mode of an interface circuit. The operational mode of the interface circuit can include one or more of the operational modes (and corresponding arrangements of one or more stimulus/sourcing, measurement, or feedback paths) as shown illustratively in the examples of FIG. 4A, FIG. 4B, FIG. 5, FIG. 6A, FIG. 6B, FIG. 7, FIG. 8, FIG. 9, or FIG. 10, and such operational modes can be selected such as using a control circuit included as a portion of an integrated circuit comprising an interface circuit or an interface system. In an example, the control circuit can include a configuration table or other configuration information stored in registers or a memory circuit. For example, at 1102, configuration information can be received by an interface circuit using a digital communication interface. Such configuration information can be used in real-time or near-real-time to configure the interface circuit, or such information can be stored for use in configuring the interface circuit when deployed for a particular application. In one example, at 1104, an current mode of operation can be selected from at least two available operational modes.

Other operation modes can include one or more of an analog current output mode, a digital input mode using either logic voltage inputs or current-mode signaling, a digital output mode, an analog voltage input mode, an analog voltage output mode, or a resistance measurement mode. At 1106, if compatibility with digital signaling is desired contemporaneously with analog current measurement, an impedance provided by the interface circuit can be selected, such as to provide a specified impedance. For example, an impedance can be selected from amongst at least two impedance ranges, including a first range 1108 from about 230 to about 600 ohms (e.g., for compatibility with HART-protocol signaling), or a lower impedance 1110, such as for a non-HART operational mode. At 1112, a current sourced or sunk by the interface circuit can be monitored, such as using single resistor for both current monitoring, and current limiting.

According to various examples herein, separate pathways can be used for stimulus, feedback, and measurement. For example, as shown and described in various examples above, a current source or sink pathway for providing stimulus can be separate from an analog feedback path used to regulate such stimulus, and a separate measurement path can be used, such as routed to a precision analog-to-digital converter through a fully-differential programmable-gain amplifier.

FIG. 12 illustrates generally a technique 1200, such as a method, that can include generating an interrogation signal to a field device at 1202, and receiving information elicited by the interrogation signal 1204, such as for use in selecting an operational mode of an interface circuit. Received information can include one or more of a measured voltage, a measured current, a measured resistance, or a combination of such values determined according to an interrogation protocol. In an example, a software-implemented or firmware-implemented technique can include semi-automatic or automatic detection of a load connected to terminals for a particular channel. For example, such a technique can include automatically detecting a mis-wire condition (such as an open-circuit, short-circuit condition, or a condition where power supply wiring is inadvertently connected to one or more input or output terminals).

For example, at 1206 such a technique can include one or more of classifying the nature of a detected field device or prompting a user to select an appropriate operational mode for the interface circuit using received information elicited by the interrogation signal, such as switching between a current-based mode of operation and a voltage-based mode of operation. In an example, the nature of a connected device can be classified at 1208 according to one or more broad classifications, such as an open-circuit condition, a short-circuit condition, and an intermediate-resistance load condition. The intermediate-resistance can be further sub-classified, such as using one or more sub-ranges within the resistance range corresponding to a broad classification. If a voltage or current is detected, a further classification may be possible. Such interrogation can be user-commanded, or can be performed automatically such as during an initial power-up, or at specified intervals during operation, such as to provide fault detection or fault tolerance in the event of mis-wiring or sensor failure.

Various Notes

Each of the non-limiting aspects described in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A configurable interface circuit supporting selectable operational modes, including modes for analog measurement and analog output on a configurable channel, including a configurable drive circuit and a configurable measurement circuit, coupleable to at least one field device that is external to an integrated circuit, the interface circuit comprising:
   the integrated circuit including:
      the configurable drive circuit including a current mode of operation, wherein a resistor is coupled to the configurable drive circuit and to the at least one field device that is external to the integrated circuit, the resistor to provide a current measurement element and a current control element; and
      the configurable measurement circuit coupled to the resistor and configured to monitor, using the resistor, a current forced through the configurable drive circuit, via the resistor, by the at least one field device.

2. The configurable interface circuit of claim 1, wherein, in the current mode of operation, a current path traversing the configurable drive circuit is established to carry a forced current having a value orders of magnitude higher than a measurement current coupled through the configurable measurement circuit.

3. The configurable interface circuit of claim 1, wherein the configurable drive circuit is configured to provide a selectable impedance at least in part using a second resistive device included as a portion of the integrated circuit, the second resistive device separate from the resistor and arranged to be selectively bypassed using a switch.

4. The configurable interface circuit of claim 3, wherein the selectable impedance is switchable between at least two ranges including a controlled-impedance range to permit the current mode of operation and contemporaneous digital communication when a digital communication signal is super-imposed on an analog current signal coupled to the configurable drive circuit.

5. The configurable interface circuit of claim 4, wherein the at least two ranges include a lower-impedance range and the controlled-impedance range, the selectable impedance including a contribution from the resistor in both the lower-impedance range and the controlled-impedance range.

6. The configurable interface circuit of claim 4, wherein the controlled-impedance range is specified to present a specified series impedance value from a range of between about 230 to about 600 ohms.

7. The configurable interface circuit of claim 4, wherein the selectable impedance comprises a lower-impedance range specified to present a series impedance value less than about 100 ohms but including a non-zero resistance contribution from the resistor, when the drive circuit is configured in the current mode of operation with the lower-impedance range selected.

8. The configurable interface circuit of claim 1, wherein the configurable drive circuit includes a powered current mode of operation wherein a current is supplied from a power supply node of the interface circuit, and an unpowered current mode of operation wherein the current is supplied from a separate power supply associated with the at least one field device.

9. The configurable interface circuit of claim 1 further comprising a digital output separate from the configurable drive circuit, the digital output configured to drive a digital signal at a terminal of the resistor when the interface circuit is configured in a digital output mode of operation.

10. The configurable interface circuit of claim 1, wherein the configurable drive circuit includes a voltage mode of operation; and
wherein the configurable measurement circuit is configured to monitor the voltage provided by the configurable drive circuit at a terminal of the resistor.

11. The configurable interface circuit of claim 1, wherein the configurable channel comprises a first channel; and wherein the configurable interface circuit includes at least two channels including the first channel.

12. The configurable interface. circuit of claim 11, wherein the resistor is a single resistor associated with the first channel for use as both a current control element and a current measurement element,
wherein a count of as few as a single respective resistor is associated with each of the at least two channels.

13. The configurable interface circuit of claim 1, wherein the current mode of operation is included amongst a plurality of selectable operational modes, the selectable operational modes including at least one of:
a controlled current output mode;
a controlled voltage output mode;
a controlled voltage measurement mode;
a temperature measurement mode;
a resistance measurement mode;
and a communication mode.

14. The configurable interface circuit of claim 1, wherein the current mode of operation is included amongst a plurality of selectable operational modes; and
wherein the configurable interface circuit comprises a control circuit configured to control the configurable interface circuit to generate an interrogation signal to the field device, and, in response to received information elicited by the interrogation signal, the control circuit configured to determine at least a class corresponding to a detected field device.

15. The configurable interface circuit of claim 1 further comprising a digital interface and control circuit, the digital interface coupled to the configurable drive circuit and the configurable measurement circuit, the digital interface configured to receive configuration information for use in selecting an operational mode of the configurable drive circuit and the configurable measurement circuit.

16. The configurable interface circuit of claim 1, wherein a measurement signal path between a terminal of the resistor and the configurable measurement circuit excludes a switching element.

17. The configurable interface circuit of claim 1, wherein a terminal of the resistor is connected directly to the configurable drive circuit and the configurable measurement circuit.

18. A configurable interface system supporting selectable operational modes, including modes for analog measurement and analog output on a configurable channel coupleable to at least one field device that is external to an integrated circuit, the modes including an unpowered current mode of operation in which a current is supplied from a separate power supply associated with the at least one field device, and the modes including a powered current mode of operation in which the current is supplied from a power supply node of the interface system such that a current path traversing a configurable drive circuit is established to carry a forced current having a value orders of magnitude higher than a measurement current coupled to a configurable measurement circuit, the interface system comprising:
a resistor; and
the integrated circuit including:
the configurable drive circuit including a current mode of operation, wherein the resistor is coupled to the configurable drive circuit and to the at least one field device that is external to the integrated circuit, the resistor to provide a current measurement element and a current control element, and
the configurable measurement circuit coupled to the resistor and configured to monitor, using the resistor, a current forced through the configurable drive circuit, via the resistor, by a the at least one field device.

19. The configurable interface system of claim 18 further comprising a series protection circuit coupled between the resistor and the configurable drive circuit.

20. The configurable interface system of claim 18, wherein a measurement signal path between a terminal of the resistor and the configurable measurement circuit excludes a switching element.

21. The configurable interface system of claim 18, wherein a terminal of the resistor is connected directly to the configurable drive circuit and the configurable measurement circuit.

22. A method for configuring an interface circuit supporting selectable operational modes, including modes for analog measurement and analog output on a configurable channel coupleable to at least one field device, the method comprising:
receiving configuration information using a digital interface included as a portion of the interface circuit;
in response to receiving the configuration information, selecting a current mode of operation for the interface circuit from amongst two or more modes of operation including at least a powered current mode of operation wherein a current is supplied from a power supply node of the interface circuit and an unpowered current mode of operation wherein the current is supplied from a separate power supply associated with the at least one field device; and
in response to receiving the configuration information and using the interface circuit, monitoring, using a resistor, a current forced through the interface circuit by the at least one field device, wherein the at least one field device is external to the interface circuit and is coupled to the resistor to force the current through the interface circuit via the resistor.

23. The method of claim 22 further comprising:
generating an interrogation signal to the at least one field device, and, in response, receiving information elicited by the interrogation signal; and
determining at least a class corresponding to a detected field device.

24. The method of claim 22, wherein the selecting the current mode of operation includes providing a selectable impedance at least in part using a second resistive device included as a portion of the interface circuit, the second resistive device separate from the resistor and arranged to be selectively bypassed using a switch.

25. The method of claim 22, wherein a measurement signal path between a terminal of the resistor and a configurable measurement circuit of the interface circuit excludes a switching element.

26. The method of claim 22, wherein a terminal of the resistor is connected directly to a configurable drive circuit and a configurable measurement circuit of the interface circuit.

* * * * *

UNITED STATES PATENT AND TRADEMARK OFFICE
CERTIFICATE OF CORRECTION

PATENT NO. : 10,181,853 B2  
APPLICATION NO. : 15/456160  
DATED : January 15, 2019  
INVENTOR(S) : Slattery et al.

Page 1 of 1

It is certified that error appears in the above-identified patent and that said Letters Patent is hereby corrected as shown below:

In the Claims

In Column 15, Line 39, in Claim 12, delete "interface." and insert --interface-- therefor  
In Column 15, Line 42, in Claim 12, delete "element," and insert --element;-- therefor  
In Column 16, Line 34, in Claim 18, delete "element," and insert --element;-- therefor  
In Column 16, Line 38, in Claim 18, after "by", delete "a"

Signed and Sealed this  
Twenty-first Day of April, 2020

Andrei Iancu  
*Director of the United States Patent and Trademark Office*